(12) United States Patent
Sienko et al.

(10) Patent No.: US 8,098,718 B2
(45) Date of Patent: Jan. 17, 2012

(54) APPARATUS AND METHODS FOR DIGITAL-TO-ANALOG CONVERSION WITH VECTOR QUANTIZATION

(75) Inventors: Matthew D. Sienko, San Diego, CA (US); Joseph G. Hamilton, San Diego, CA (US); Iain W. Finlay, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 224 days.

(21) Appl. No.: 12/640,864

(22) Filed: Dec. 17, 2009

(65) Prior Publication Data

US 2011/0002264 A1 Jan. 6, 2011

Related U.S. Application Data

(60) Provisional application No. 61/222,346, filed on Jul. 1, 2009.

(51) Int. Cl.
*H04L 25/00* (2006.01)
*H04L 27/00* (2006.01)

(52) U.S. Cl. ........ 375/216; 375/328; 375/245; 375/247; 341/144; 341/143; 341/147; 341/145; 341/148

(58) Field of Classification Search .................. 375/216, 375/328, 245, 247; 341/144, 143, 147, 148, 341/145
See application file for complete search history.

(56) References Cited

U.S. PATENT DOCUMENTS

| | | | | |
|---|---|---|---|---|
| 5,684,482 A | * | 11/1997 | Galton | 341/144 |
| 6,531,973 B2 | * | 3/2003 | Brooks et al. | 341/143 |
| 6,697,004 B1 | * | 2/2004 | Galton et al. | 341/144 |
| 7,023,371 B2 | * | 4/2006 | Schoner | 341/144 |
| 7,123,178 B2 | * | 10/2006 | Ishizuka et al. | 341/144 |
| 7,304,593 B2 | * | 12/2007 | Luecking et al. | 341/143 |
| 7,414,558 B2 | * | 8/2008 | Rivoir et al. | 341/144 |
| 7,567,195 B2 | * | 7/2009 | Magrath | 341/144 |

OTHER PUBLICATIONS

International Search Report and Written Opinion—PCT/US2010/040831, International Search Authority—European Patent Office—Oct. 5, 2010.

(Continued)

*Primary Examiner* — Phuong Phu
(74) *Attorney, Agent, or Firm* — Jiayu Xu; Eric Ho

(57) ABSTRACT

A digital-to-analog converter (DAC) includes a mismatch shaping feedback vector quantizer configured to store state information in expanded format using One-Hot Encoding of a matrix. The expanded state format storage enables implementation of a simplified state sorter for the vector feedback mechanism of the vector quantizer. The simplified state sorter may minimize the variance of ones (or other symbols representing state values) in the matrix, and allow performing sorting in a reduced number of clock cycles. For example, sorting may be performed on a predetermined edge of single clock cycle, or on two edges of the same clock cycle. The matrix may be normalized periodically or as needed, to avoid overflow and underflow. The DAC may be used as a quantizer of a modulator of an access terminal in a cellular communication system.

36 Claims, 4 Drawing Sheets

OTHER PUBLICATIONS

Tao Shui et al: "Modified mismatch-shaping for continuous-time delta-sigma modulators" Custom Integrated Circuits Conference, 1998. Proceedings of the IEEE 1 998 Santa Clara, CA, USA May 11-14, 1998, New York, NY, USA,IEEE, US, May 11, 1998 , pp. 225-228, XP010293936 ISBN: 978-0-7803-4292-7 cited in the application sections II and III.C; figures 1, 2, 4, 5.

Baird et al., "Improved Sigma-Delta DAC Linearity Using Data Weighted Averaging", IEEE, School of Electrical Engineering and Computer Science, Washington State University, pp. 13-16 , 1995.

Galton, "Spectral Shaping of Circuit Errors in Digital-to-Analog Converters", IEEE Transactions on Circuits and Systems-II: Analog and Digital Signal Processing, vol. 44, No. 10, pp. 808-817, Oct. 1997.

Schreier et al., "Noise-Shaped Multbit D/A Convertor Employing Unit Elements", Electronics Letters, vol. 31, No. 20, pp. 1712-1713, Sep. 28, 1995.

Shui et al., "Modified Mismatch-Shaping for Continuous-Time Delta-Sigma Modulators", IEEE Custom Integrated Circuits Conference 1998, 11.1.1-11.1.4, pp. 225-228.

Welz et al., "Necessary and Sufficient Conditions for Mismatch Shaping in a General Class of Multibit DACs", IEEE Transactions on Circuits and Systems-II: Analog and Digital Signal Processing, vol. 49, No. 12, pp. 748-759, Dec. 2002.

* cited by examiner

APPARATUS AND METHODS FOR DIGITAL-TO-ANALOG CONVERSION WITH VECTOR QUANTIZATION

CROSS-REFERENCE TO RELATED APPLICATION

This application claims the benefit under 35 U.S.C. §119 of Provisional Application Ser. No. 61/222,346, filed Jul. 1, 2009, and said provisional application is incorporated herein by reference.

BACKGROUND

1. Field

Apparatus and methods described in this document relate to electronic circuit designs. More specifically, the apparatus and methods relate to vector quantizers.

2. Background

Digital-to-analog converters (DACs) are widely used in communication systems and in many other applications. In communication systems, DACs may be used to modulate an analog waveform with information carried or generated in digital form. Oversampling and quantization noise shaping techniques may be employed together with DACs to perform data conversion. Advantageously, such techniques may be implemented in highly-integrated digital circuitry.

Size, speed, cost, and power consumption are important performance criteria in many applications, and especially in battery-powered portable and mobile applications. Therefore, a need exists for smaller, faster, less costly, and less power-hungry DACs, as well as for methods for operating such DACs and memories storing code of steps of the methods. A need further exists for improved DACs that implement vector quantization and spectral shaping, without excessive complexity or power consumption.

SUMMARY

Embodiments disclosed herein may address one or more of the above stated needs by providing DAC designs in which a vector quantizer stores state information in expanded format using One-Hot Code or One-Hot Encoding. The expanded state format storage enables implementation of a simplified single-cycle state sorter for the vector feedback mechanism of the vector quantizer.

In an embodiment, a quantizer includes a converter configured to receive a next weighted digital value representing a next analog voltage and generate a next thermometer value $Dint[1]$ representation of the next weighted digital value. The quantizer also includes a plurality of one-bit converters, each one-bit converter having an input and an output. The quantizer additionally includes a summer configured to receive the outputs of the plurality of one-bit converters and output an analog voltage substantially equal to sum of the outputs. The quantizer further includes a mismatch shaping block. The mismatch shaping block is configured to (1) determine a number Ton of the one-bit converters that need to be switched from off to on, and a number Toff of the one-bit converters that need to be switched from on to off, wherein the next thermometer value $Dint[1]$ is equal to (Ton−Toff) plus a current thermometer value $Dint[0]$ representation of a current weighted digital value received by the converter; (2) store state values representing history of the plurality of one-bit converters over a predetermined number of immediately preceding quantization operations performed by the quantizer, wherein the history is stored using One-Hot Encoding; (3) determine a next output vector based on the history, Ton, Toff, and the current weighted digital value; and (4) drive the inputs of the plurality of one-bit converters with the next output vector, one element of the next output vector per one-bit converter.

In an embodiment, a quantization method includes a step of receiving a next weighted digital value representing a next analog voltage. The method also includes generating a next thermometer value $Dint[1]$ representation of the next weighted digital value. The method additionally includes summing outputs of a plurality of one-bit converters to produce an analog voltage substantially equal to sum of the outputs. The method further includes determining a number Ton of the one-bit converters that need to be switched from off to on, and a number Toff of the one-bit converters that need to be switched from on to off, wherein the next thermometer value $Dint[1]$ is equal to (Ton−Toff) plus a current thermometer value $Dint[0]$ representation of a current weighted digital value. The method further includes storing state values representing history of the plurality of one-bit converters over a predetermined number of immediately preceding quantization operations, wherein the history is stored using One-Hot Encoding. The method further includes determining a next output vector based on the history, Ton, Toff, and the current weighted digital value. The method further includes driving the inputs of the plurality of one-bit converters with the next output vector, one element of the next output vector per one-bit converter.

In an embodiment, a quantizer includes a converter configured to receive a next weighted digital value representing a next analog voltage and generate a next thermometer value $Dint[1]$ representation of the next weighted digital value. The quantizer also includes a plurality of one-bit converters, each one-bit converter having an input and an output. The quantizer additionally includes a summer configured to receive the outputs of the plurality of one-bit converters and output an analog voltage substantially equal to sum of the outputs. The quantizer further includes a mismatch shaping block. The mismatch shaping block includes (1) logic configured to determine a number Ton of the one-bit converters that need to be switched from off to on, and a number Toff of the one-bit converters that need to be switched from on to off, wherein the next thermometer value $Dint[1]$ is equal to (Ton−Toff) plus a current thermometer value $Dint[0]$ representation of a current weighted digital value received by the converter; (2) means for storing state values representing history of the plurality of one-bit converters over a predetermined number of immediately preceding quantization operations performed by the quantizer, wherein the history is stored using One-Hot Encoding; (3) means for determining a next output vector based on the history, Ton, Toff, and the current weighted digital value; and (4) connections for driving the inputs of the plurality of one-bit converters with the next output vector, one element of the next output vector per one-bit converter.

In an embodiment, a quantization method includes step of receiving a next weighted digital value representing a next analog voltage. The method also includes generating a next thermometer value $Dint[1]$ representation of the next weighted digital value. The method additionally includes summing outputs of a plurality of one-bit converters to produce an analog voltage substantially equal to sum of the outputs. The method further includes step for determining a number Ton of the one-bit converters that need to be switched from off to on, and a number Toff of the one-bit converters that need to be switched from on to off, wherein the next thermometer value $Dint[1]$ is equal to (Ton−Toff) plus a current thermometer value $Dint[0]$ representation of a current weighted digital value received by the converter. The method further includes step for storing state values representing history of the plurality of one-bit converters over a predetermined number of immediately preceding quantization operations, wherein the history is stored using One-Hot Encoding. The method further includes step for determining a next output vector based on the history, Ton, Toff, and the current weighted digital value. The method further includes driving the inputs of the plurality of one-bit converters with the next output vector, one element of the next output vector per one-bit converter.

This and other embodiments and aspects of the present invention will be better understood with reference to the following description, drawings, and appended claims.

DETAILED DESCRIPTION

Figure 1:
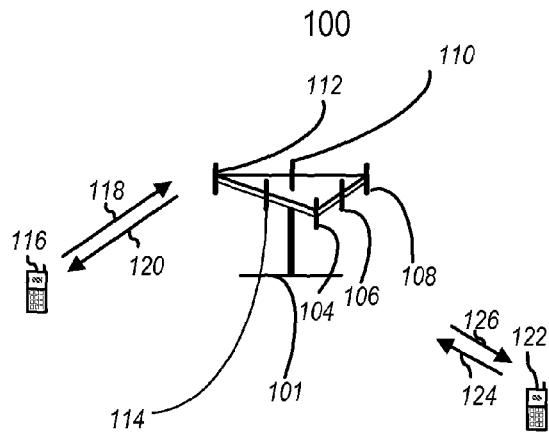
FIG. 1 illustrates selected elements of a multiple access wireless communication system that may be configured in accordance with embodiments described in this document.

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

The digital-to-analog conversion apparatus and methods described in this document may be used in communication devices configured to operate in various wireless communication networks, including CDMA networks, TDMA networks, FDMA networks, OFDM and OFDMA networks, Single-Carrier FDMA (SC-FDMA) networks, and other networks and peer-to-peer systems. The apparatus and methods may be used on both forward and reverse links. Further, the apparatus and methods are not necessarily limited to wireless or other communication systems, but may be used in any apparatus where digital signals are converted into analog form. The terms "networks" and "systems" are often used interchangeably. A CDMA network may implement a radio technology such as Universal Terrestrial Radio Access (UTRA), cdma2000, and other technologies. UTRA networks include Wideband-CDMA (W-CDMA) and Low Chip Rate (LCR) networks. The cdma2000 designates IS-2000, IS-95, and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM, and other technologies. UTRA, E-UTRA, and GSM are parts of Universal Mobile Telecommunication System (UMTS). Long Term Evolution (LTE) is a release of UMTS that uses E-UTRA. UTRA, E-UTRA, GSM, UMTS and LTE are described in documents from an organization known as the "3rd Generation Partnership Project" (3GPP). The cdma2000 standard is described in documents from an organization known as the "3rd Generation Partnership Project 2" (3GPP2). Certain aspects of the techniques may be described in the context of LTE systems, and LTE terminology may be used in the description below, but the techniques may be applicable to other standards and technologies.

A multiple access wireless communication system 100 according to one embodiment is illustrated in FIG. 1. An access point or a base transceiver station 101 includes multiple antenna groups, one group including antennae 104 and 106, another group including antennae 108 and 110, and an additional group including antennae 112 and 114. Although only two antennae are shown for each antenna group, more or fewer antennae may be included in any of the antenna groups. The BTS 101 may also include a single antenna group, or have only a single antenna. An access terminal (AT) 116 is in communication with the antennae 112 and 114, where antennae 112 and 114 transmit information to the access terminal 116 over a forward link 120, and receive information from the access terminal 116 over a reverse link 118. Another access terminal 122 is in communication with antennae 106 and 108, where the antennae 106 and 108 transmit information to the access terminal 122 over a forward link 126 and receive information from the access terminal 122 over a reverse link 124. In an FDD system, each of the communication links 118, 120, 124 and 126 may use a different frequency for communications between access terminals and a particular antenna or antenna group, as well as different frequencies for forward and reverse links. For example, the forward link 120 may use a different frequency than that used by the reverse link 118, and still another frequency than that used by the forward link 126. The use of different frequencies, however, is not necessarily a requirement of the invention.

Each group of antennae and the area in which it is designed to communicate is often referred to as a sector. As shown in FIG. 1, each of the antenna groups is designed to communicate with access terminals in a different sector of the area covered by the BTS 101.

In communications over the forward links 120 and 126, the transmitting antennae of the BTS 101 use beamforming in order to improve the signal-to-noise ratio of the forward links for the different access terminals 116 and 122. Additionally, beamforming reduces interference for access terminals in neighboring cells, as compared to forward link transmissions through a single antenna to all its access terminals. Beamforming is also not necessarily a requirement of the invention.

An access point or a base transceiver station may be a fixed station used for communicating with the terminals and may also be referred to as a Node B or by some other term. An access terminal may also be called a mobile unit, user equipment (UE), a wireless communication device, terminal, mobile terminal, or some other term.

Figure 2:
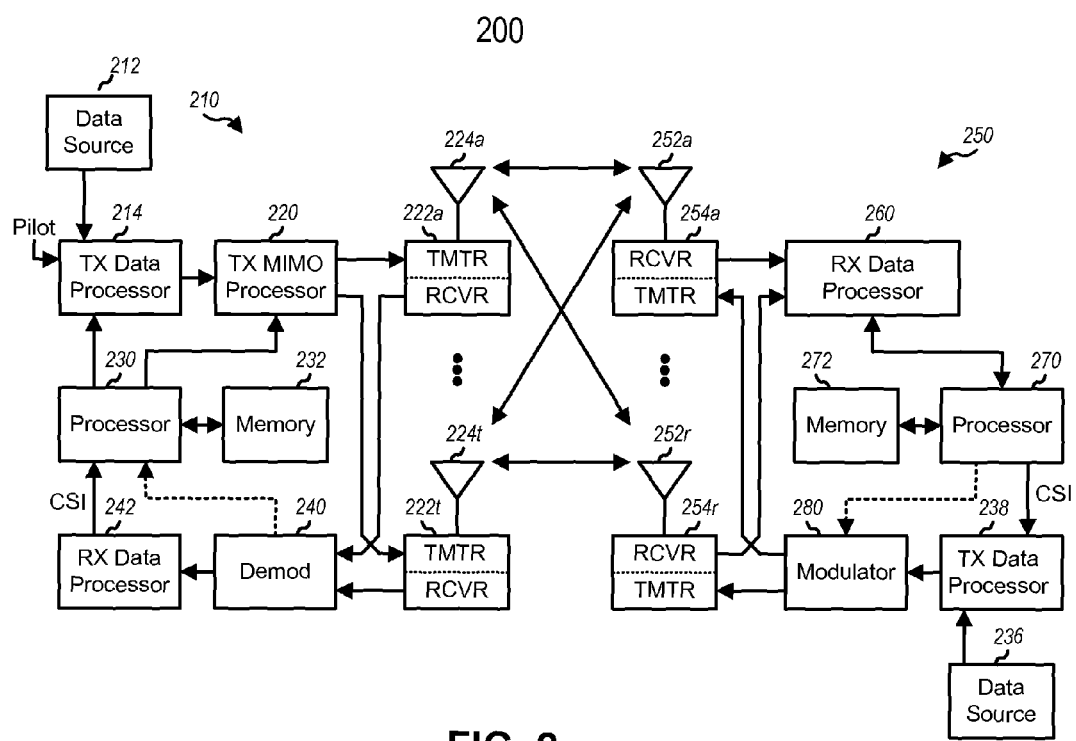
FIG. 2 illustrates in block diagram manner selected components of a wireless MIMO communication system that may be configured in accordance with embodiments described in this document.

FIG. 2 shows, in a block diagram form, selected components of an embodiment of a wireless MIMO communication system 200 that includes a transmitter system 210 of a base transceiver station and a receiver system 250 of an access terminal.

At the transmitter system 210, traffic data for a number of data streams is provided by a data source 212 to a transmit (Tx) data processor 214. In an embodiment, each data stream is transmitted over a respective transmit antenna or antenna group. The Tx data processor 214 formats, codes, and interleaves the traffic data for each data stream based on a particular coding scheme selected for that data stream to provide coded data. The coded data for each data stream may be multiplexed with pilot data using OFDM techniques. The pilot data is a known data pattern that is processed in a known manner and may be used at the receiver system to estimate the physical channel response or transfer function. The multiplexed pilot and coded data for each data stream are then modulated (i.e., symbol mapped) based on a particular modulation scheme selected for that data stream, to obtain modulation symbols. The modulation scheme may be selected, for example, from binary phase-shift keying (BPSK), quadrature phase-shift keying (QPSK), M-ary Phase-Shift Keying (M-PSK), and multilevel quadrature amplitude modulation (M-QAM). The data rate, coding, and modulation for each data stream may be determined by instructions performed by a processor 230.

The modulation symbols for all data streams are provided to a Tx MIMO processor 220, which may further process the modulation symbols (e.g., for OFDM). The Tx MIMO processor 220 then provides $N_T$ modulation symbol streams to $N_T$ transmitters (TMTRs) 222a through 222t. In certain embodiments, the Tx MIMO processor 220 applies beamforming weights to the symbols of the data streams and to the antennae from which the symbols are transmitted.

Each transmitter 222 receives and processes a respective symbol stream to provide one or more analog signals, and further conditions (e.g., amplifies, filters, upconverts) the analog signals to provide a modulated signal suitable for transmission over its corresponding MIMO channel. The $N_T$ modulated signals from the transmitters 222a through 222t are transmitted from the $N_T$ antennae 224a through 224t, respectively. The antennae 224 may be the same as or different from the antennae 104-114 shown in FIG. 1.

At the receiver system 250, the transmitted modulated signals are received by $N_R$ antennae 252a through 252r, and the received signal from each antenna 252 is provided to a respective receiver (RCVR) 254a through 254r. Each of the receivers 254 conditions (e.g., filters, amplifies, downconverts) its respective received signal, digitizes the conditioned signal to provide samples, and further processes the samples to provide a corresponding received symbol stream.

A receive (Rx) data processor 260 receives and processes the $N_R$ received symbol streams from the $N_R$ receivers 254, based on a particular receiver processing technique, to provide $N_T$ detected symbol streams. The Rx data processor 260 then demodulates, deinterleaves, and decodes each detected symbol stream to recover the traffic data of the data stream. The processing by the Rx data processor 260 is complementary to that performed by the Tx MIMO processor 220 and the Tx data processor 214 at the transmitter system 210.

A processor 270 periodically determines which pre-coding matrix to use. The processor 270 formulates a reverse link message comprising a matrix index portion and a rank value portion. The reverse link message may include miscellaneous information regarding the communication link and/or the received data stream.

The reverse link message is then processed by a Tx data processor 238, which also receives traffic data for a number of data streams from a data source 236. The traffic data and the reverse link message are modulated by a modulator 280, conditioned by transmitters 254a through 254r, and transmitted to the transmitter system 210.

At the transmitter system 210, the modulated signals from the receiver system 250 are received by the antennae 224, conditioned by receivers 222, demodulated by a demodulator 240, and processed by an Rx data processor 242 to extract the reverse link messages transmitted by the receiver system 250. The processor 230 determines which pre-coding matrix to use for determining the beamforming weights, and processes the extracted message.

The modulator 280 of the receiver system 250 and the processor 230 of the transmitter 210 may each include a multi-bit analog-to-digital converter (ADC) in accordance with embodiments and variants described below in relation to the FIG. 3 through the last Figure.

Figure 3:
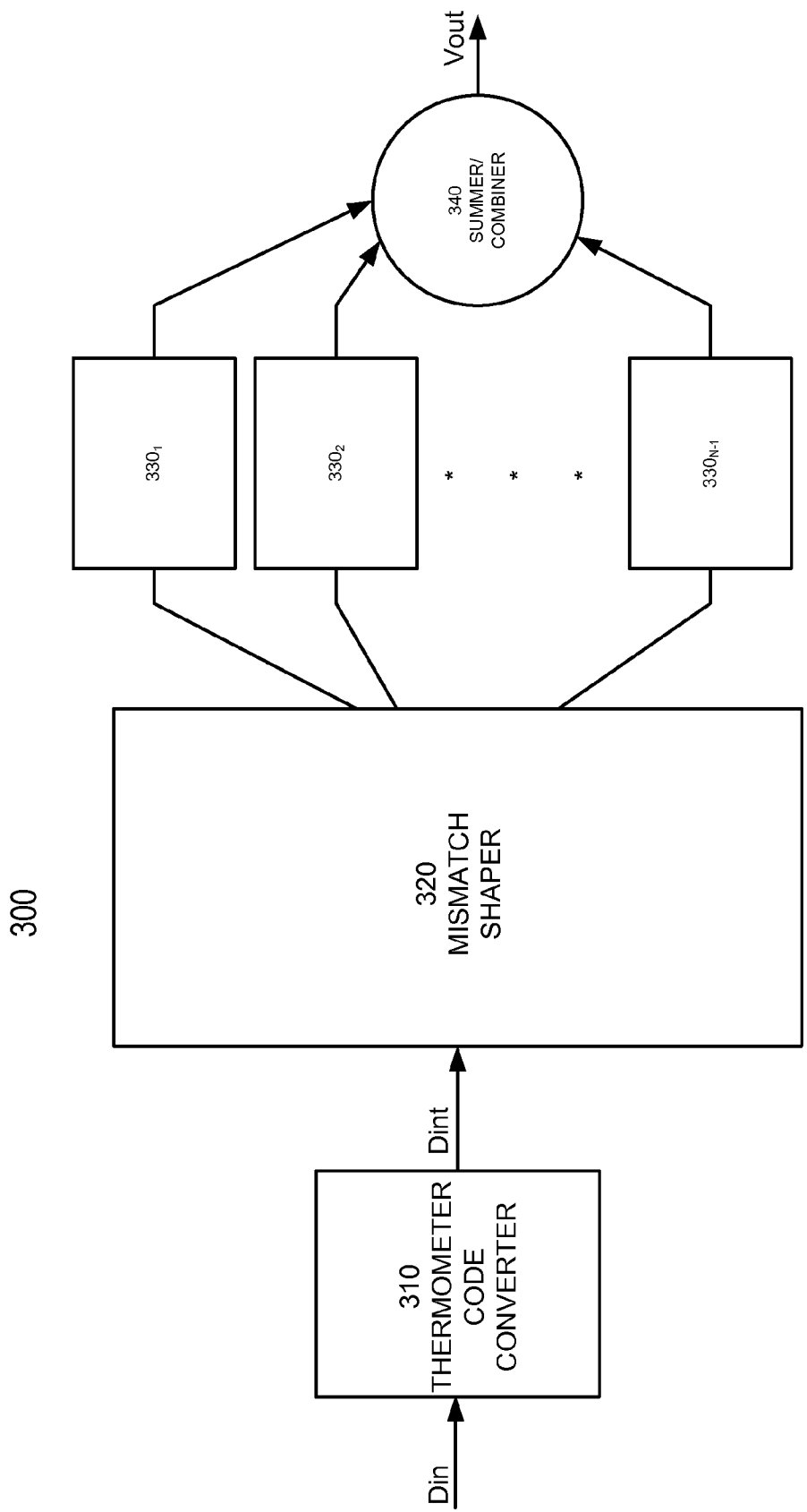
FIG. 3 shows selected blocks of a mismatch shaping feedback vector quantizer.

FIG. 3 shows selected blocks of a generalized N-bit mismatch shaping feedback vector quantizer 300. The quantizer 300 may be implemented as an application specific integrated circuit using logic element blocks. The quantizer 300 receives a weighted digital input Din, which represents an analog value, and outputs the corresponding voltage approximation of the analog value Vout. The digital input Din may be a binary signed number. The digits in the input Din may be weighted (using binary weights, for example); in the case of 4-bit resolution, for example, Din may represent any value between −8 and +7 (1000 through 0111, for example).

The vector quantizer 300 includes a register 310 configured to convert the input Din into its thermometer code equivalent value, i.e., a base one binary number in which each digit carries the same weight. We may refer to the output of the register 310 as "unshaped" thermometer code.

Note that the nature of thermometer encoding is such that, even with a minimum number of digits (sixteen in the case of a 4-bit Din), most values are capable of redundant representation. For example, the value of one can be represented in sixteen different ways. Additionally, the register 310 may be configured to use a thermometer code with more than the minimum number of digits. As a person of skill in the pertinent art would understand after perusal of this document, every Din value will have redundant thermometer code representations when more than the minimum number of bits/digits are used. In an embodiment, the register 310 converts a 4-bit binary Din into an 18-bit unshaped thermometer code.

The vector quantizer 300 also includes a mismatch shaping block 320 that is configured to receive the unshaped thermometer code from the register 310 and perform a number of operations including converting the unshaped thermometer code into what we will refer to as a "shaped" thermometer code. The output of the mismatch shaping block 320 drives N (e.g., 18) 1-bit converters $330_0$ through $330_{N-1}$. Each one of the 1-bit converters 330 outputs a voltage value depending on the value of its digital input. The outputs of the 1-bit converters 330 are inputted into a voltage summer/combiner 340, which sums them to produce at its output the analog voltage Vout corresponding to the digital input Din. Each "1" value outputted by one of the 1-bit converters 330 has the effect of increasing the Vout by approximately some predetermined voltage difference $\Delta_v$, and each "0" value has the effect of not increasing Vout; alternatively, a "1" value has the effect of increasing the Vout by approximately some predetermined voltage difference $\Delta_v/2$, and a "0" value has the effect of decreasing the Vout by approximately the same voltage difference $\Delta_v/2$. These are, of course, merely examples.

Shaping of the thermometer code (executed in the mismatch shaping block 320) is essentially a selection of a shaped code value from a number of redundant equivalent values corresponding to the same input Din (or Dint). The selection is performed based on the history of the previous selections made in the vector quantizer 300 (i.e., the state of the vector quantizer 300). Such selection allows a reduction in the quantization noise at the output of the vector quantizer 300, and particularly a reduction in the noise due to mismatching between and among the various 1-bit converters 330.

Figure 4:
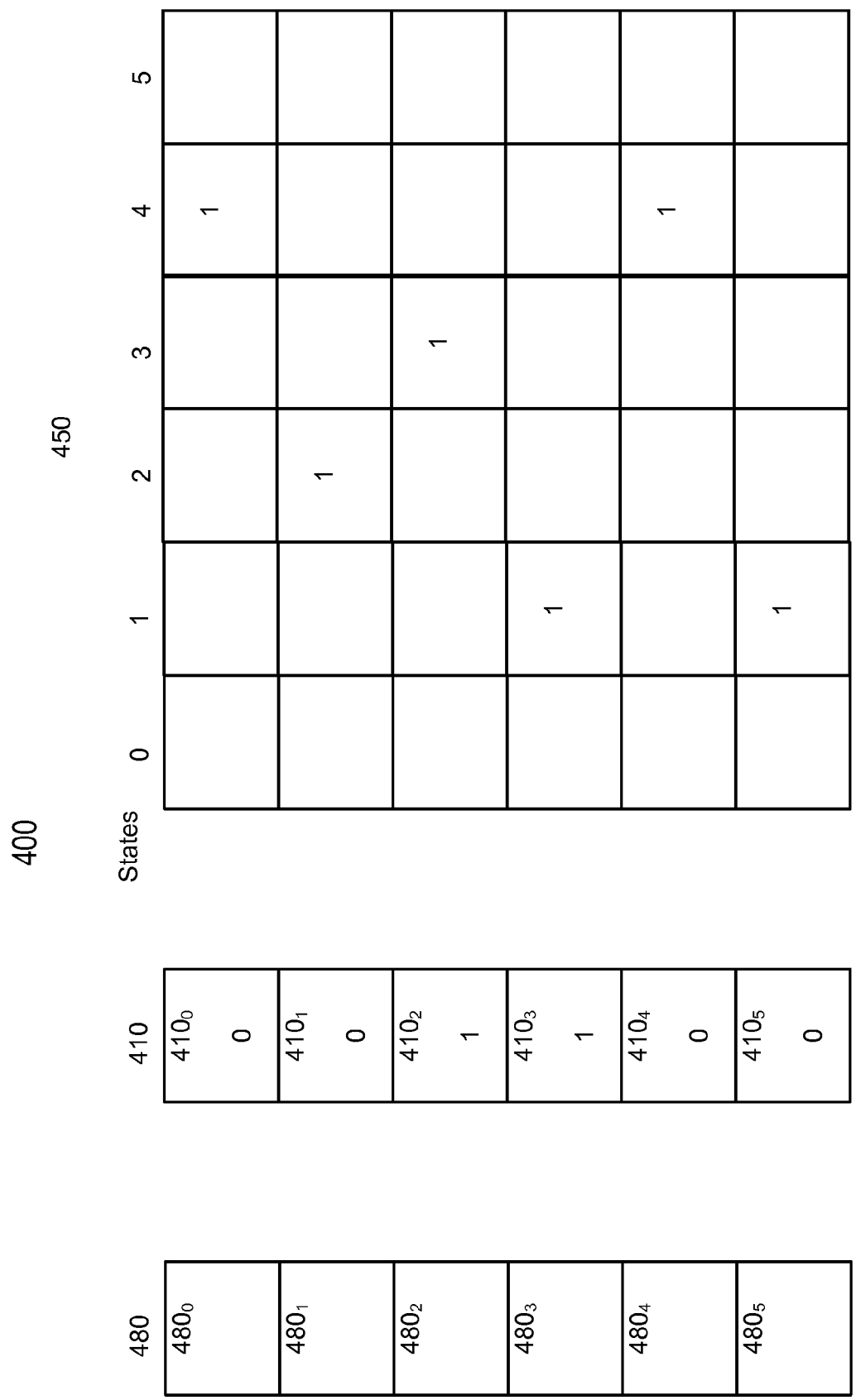
FIG. 4 illustrates selected features of a mismatch shaping feedback vector quantizer.

The history of selections may be stored using a vector and a matrix, as follows. As shown in FIG. 4, a vector 410 stores the values of the current selections for each individual 1-bit converter 330, with each vector element $410_i$, storing the current selection or setting of the corresponding 1-bit converter $330_i$. The current selections are based on the current value of Din and on the selections from among the redundant codes made for the current output of the vector quantizer 300; that is, the current selections correspond to the shaped thermometer code for the current period. As also shown in FIG. 4, a sparse matrix (i.e., a matrix populated mostly by 0 values) 450 stores values corresponding to the number of occurrences of 1's for each of the 1-bit converters 330, during some predetermined immediately preceding period. Each row of the matrix 450 corresponds to a different converter 330, and contains a single 1 expressing the number of occurrences of 1's for that particular converter 330. The position of the 1 in the row may be determined by One-Hot Encoding (OHE), so that there is only a single 1 in the row with the remaining positions occupied by zeros.

In the example of FIG. 4, the left-most position (number 0 position) of each row, when occupied, corresponds to 0 occurrences; the next position to the right (number 1 position) corresponds to 1 occurrence; the third position from left (number 2 position) corresponds to 2 occurrences; the fourth position from left (number 3 position) corresponds to 3 occurrences; and so on.

It should be noted that the specific sizes of the vector 410 and of each dimension of the matrix 450, and the values in the vector and the matrix, are shown merely to illustrate the examples discussed.

In operation, a next Din value is received, which we can refer to as Din[1], and the register 310 converts it into its thermometer code equivalent value, Dint[1], which is "unshaped" as has been explained above. The mismatch shaping block 320 compares Dint[1] to the current Dint[0] to determine (1) a number Ton of the 1-bit converters 330 that need to be switched from off to on, and (2) a number Toff of the 1-bit converters 330 that need to be switched from on to off such that Dint[1]=Dint[0]+Ton−Toff. The determinations of Ton and Toff may be done using several different algorithms, including a constant switching algorithm and an unconstrained switching algorithm. In accordance with the constant switching algorithm, the number of 1-bit converters 330 being switched is kept as constant as possible, subject to the constrains imposed by Dint[1] and Dint[0]. In accordance with the unconstrained switching algorithm, the number of converters 330 being switched is maximized, again subject to the limitations imposed by Dint[1] and Dint[0]. It should be noted that some embodiments may use other algorithms.

Given Ton and Toff, the logic of the mismatch shaping block 320 determines the next vector 480 so as to keep the total number of 1's relatively constant over the recent history and across the different rows. In other words, the variance of 1's in the matrix 450 may be kept to a minimum or a relatively small value; thus, the logic attempts to keep the 1's in about the same or close-by columns. Advantageously, the mismatch shaping block 320 is configured to do so in a single clock cycle, using combinational logic, or combinational logic that operates on both transitions of the same clock. The design of the storage for the vector 410 and the matrix 450, and the use of OHE, may greatly simplify the circuitry for determining the next vector based on the OHE of the matrix 450. The determination of Ton/Toff may also be performed in the same cycle.

In more detail, the logic of the mismatch shaping block 320 attempts to move as many 1's at the left side of the matrix (i.e., from low states) towards right (toward higher states), and to move as many 1's at the right side of the matrix towards left (or at least prevent their further movement to right). Note that left and right are specific to the example, and the sides can be easily reversed with the low states on the right, high states on the left.

Continuing with the exemplary values shown in FIG. 4, let us assume that there are a total of six 1-bit converters $330_0$-$330_5$, Din[0] corresponds to three of the converters 330 being turned on ($330_2$, $330_3$, and $330_5$, with the rest being turned off), the OHE values in the table 450 as shown, and Din[1] corresponds to four of the converters 330 being turned on (with the rest being turned off). Let us further assume that for the next cycle, Ton=2 and Toff=1. As mentioned above, various algorithm can result in different Ton and Toff values, constrained by Din[0] and Din[1]; in the present example, Ton=(Toff+1). The single-cycle logic of the mismatch shaping block 320 looks at the lowest state (0) in the matrix 450, and selects one or more of the 1-bit converters that are not currently on, for setting them on; if this is possible, the logic subtracts the number of those set to on from Ton, and carries the remainder to the next lowest state; if this is not possible, the logic moves to the next lowest state without having adjusted Ton. The process continues for increasing states until Ton is exhausted. Then, the logic begins with the highest state and attempts to turn off as many of the 1-bit converters as possible, subtracts the number so turned off from Toff, and carries the remainder of Toff to the next highest state, and repeats until the Toff is exhausted. The remaining undetermined bits of the next vector 480 are carried over from the current vector 410. All this may advantageously be accomplished in a single clock cycle. Note that the order of exhausting Ton and Toff can be reversed, i.e., Toff can be exhausted first, beginning with the highest state.

In this way, the next vector 480 is determined, and the 1-bit converters 330 are put in the next state. The values of the current vector 410 are used to update the matrix 450 (each "1" bit in the vector 410 increases the state of the corresponding row, e.g., moving the "1" in the corresponding row to the right). The values of the vector 480 are moved to the vector 410, so that the "next" now becomes "current" for the next iteration. The next Din thus becomes the current Din, and a "new" next Din is read in. The matrix 450 may be normalized to avoid overflow and underflow, for example, by moving the values in it right or left so as to provide the maximum clearance (columns with all zeros) on each side. The operations continue to be repeated for the subsequent Din values.

Figure 5:
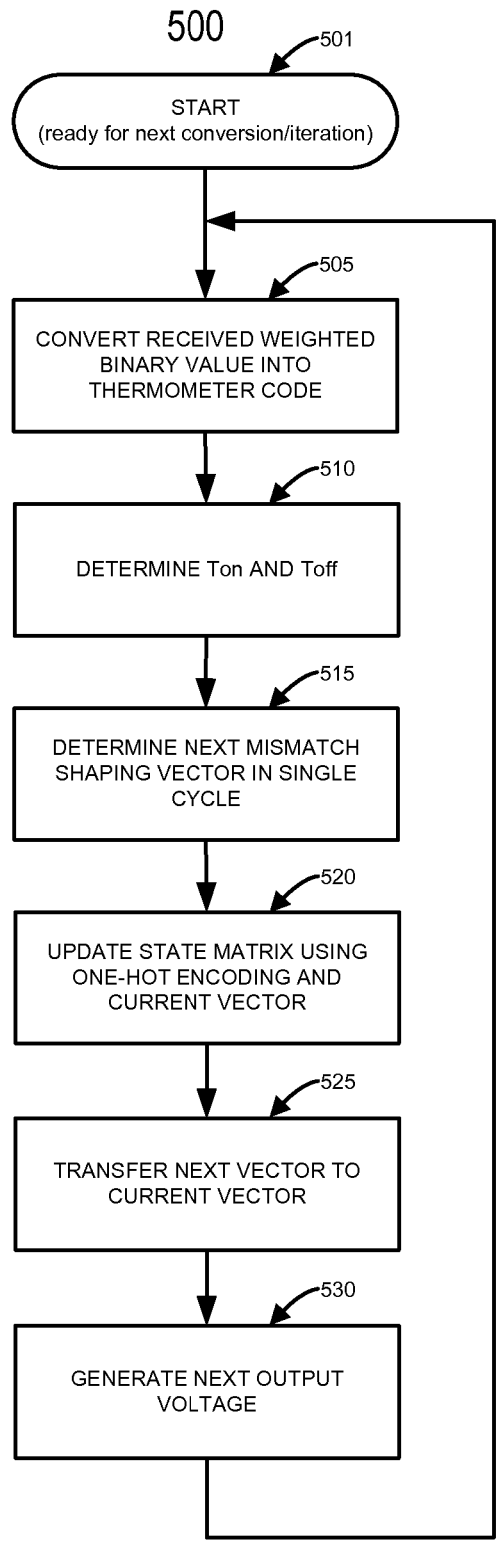
FIG. 5 illustrates selected steps of a process for operating a mismatch shaping feedback vector quantizer.

FIG. 5 illustrates selected steps of an exemplary process 500 for operating the vector quantizer 300. At a flow point 501, the vector quantizer 300 is ready to perform conversion for the next weighted value Din[1].

At step 505, the value of Din[1] is converted into its thermometer code equivalent Dint[1].

At step 510, the logic of the converter (e.g., block 320) determines Ton and Toff, based on Din[1], the current Din[0], using the constant switching algorithm, unconstrained switching algorithm, or another algorithm.

At step 515, the logic operates on its inputs (values of the current vector 410 and current matrix 450) to determine the next vector 480, in a manner that has been discussed above. For example, the logic attempts to reduce or minimize the variance of the states of the rows corresponding to the different 1-bit converters, moving the converters with low states to higher states (if possible), and moving the converters with high states to lower states (if possible). Note that instead of attempting to move the converters in the higher states to lower states, the logic can attempt to prevent increasing the state of each of such converters. In performing the step 515, the logic creates and maintains the matrix 450 using One-Hot Encoding, and performs the step in a single clock cycle using combinational logic operating from a single edge or the two edges of the cycle.

In step 520, the matrix 450 is updated to its next value using the current vector 410.

In step 525, the value of the next vector 480 is loaded into the current vector 450.

In step 530, the 1-bit converters 330 are driven with the next vector 480 and their outputs are summed to generate the next Vout.

Process flow then returns to the step 505.

A person skilled in the art may find general background information relating to operation of mismatch shaping feedback vector quantizers and their associated algorithms in the following sources, each of which is hereby incorporated by reference in its entirety as if fully set forth herein, including Figures and Tables:

1. Welz et al., Necessary and Sufficient Conditions for Mismatch Shaping in a General Class of Multibit DACs, TRANSACTIONS ON CIRCUITS AND SYSTEMS—II: ANALOG AND DIGITAL SIGNAL PROCESSING, VOL. 49, NO. 12, pp 748-59 (IEEE 2002);

2. Baird et al., Improved ΔΣ DAC Linearity Using Data Weighted Averaging, International Symposium on Circuits and Systems pp 13-16 (IEEE 1995);

3. Schreier et al., Noise-shaped multbit D/A convertor employing unit elements, Electronics Letters Vol. 35, No. 20, pp 1712-13 (IEEE 28 Sep. 1995);

4. Shui et al., Modified Mismatch-Shaping for Continuous-Time Delta-Sigma Modulators, CUSTOM INTEGRATED CIRCUITS CONFERENCE pp 225-28 (IEEE 1998); and 5. Galton, Spectral Shaping of Circuit Errors in Digital-to-Analog Converters, TRANSACTIONS ON CIRCUITS AND SYSTEMS—II: ANALOG AND DIGITAL SIGNAL PROCESSING, VOL. 44, NO. 10, pp 808-17 (IEEE October 1997).

Other materials may also be available and may be found useful.

Although steps and decisions of various methods may be described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described and/or shown in the accompanying Figures. Furthermore, not every illustrated step and decision may be required in every embodiment or variant, while some steps and decisions that have not been specifically illustrated may be desirable in some embodiments/variants.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. A quantizer comprising:
   a thermometer code converter configured to receive a next weighted digital value representing a next analog voltage and generate a next thermometer value Dint[1] representation of the next weighted digital value;
   a plurality of one-bit converters, each one-bit converter comprising an input and an output;
   a summer configured to receive the outputs of the plurality of one-bit converters and output an analog voltage substantially equal to sum of the outputs;
   a mismatch shaping block configured to:
      determine a number Ton of the one-bit converters that need to be switched from off to on, and a number Toff of the one-bit converters that need to be switched from on to off, wherein the next thermometer value Dint[1] is equal to (Ton−Toff) plus a current thermometer value Dint[0] representation of a current weighted digital value received by the thermometer code converter,
      store state values representing history of the plurality of one-bit converters over a predetermined number of immediately preceding quantization operations performed by the quantizer, wherein the history is stored using One-Hot Encoding,
      determine a next output vector based on the history, Ton, Toff, and the current weighted digital value, and
      drive the inputs of the plurality of one-bit converters with the next output vector, one element of the next output vector per one-bit converter.

2. A quantizer according to claim 1, wherein the mismatch shaping block is further configured so that the next output vector is determined by sorting the state values, and variance of symbols representing the state values is minimized.

3. A quantizer according to claim 2, wherein the mismatch shaping block is further configured so that the sorting is performed in a single cycle of a clock driving the quantizer.

4. A quantizer according to claim 3, wherein the mismatch shaping block is further configured so that the sorting is performed on a single edge of the clock driving the quantizer, the weighted digital values changing with the clock.

5. A quantizer according to claim 3, wherein the mismatch shaping block is further configured so that the sorting is performed on both edges of the clock driving the quantizer, the weighted digital values changing with the clock.

6. A quantizer according to claim 3, wherein the mismatch shaping block is further configured so that Ton and Toff are determined in accordance with a constant switching algorithm.

7. A quantizer according to claim 3, wherein the mismatch shaping block is further configured so that Ton and Toff are determined in accordance with an unconstrained switching algorithm.

8. A quantizer according to claim 3, wherein the mismatch shaping block is further configured to update the state values representing history with the next output vector.

9. A quantizer according to claim 3, wherein the mismatch shaping block is further configured so that the history is stored in a sparse matrix.

10. A quantizer according to claim 9, wherein the mismatch shaping block is further configured to determine the next output vector by (1) incrementally advancing from the lowest state in the sparse matrix to higher states until Ton is exhausted, at each state of the sparse matrix selecting one or more of the elements of the output vector that correspond to the one-bit converters that are not on and setting them to correspond to the one-bit converters being on, if possible, and decreasing Ton for each of the elements that is set to correspond to a one-bit converter that is set on; (2) incrementally advancing from the highest state in the sparse matrix to lower states until Toff is exhausted, at each state of the sparse matrix selecting one or more of the elements of the output vector that correspond to the one-bit converters that are not off and setting them to correspond to the one-bit converters being off, if possible, and decreasing Toff for each of the elements that is set to correspond to a one-bit converter that is set off; and (3) after incrementally advancing from the lowest state and incrementally advancing from the highest state, setting remaining undetermined elements of the next output vector to values of corresponding elements of a current output vector, the current output vector being based on the current thermometer value.

11. A quantizer according to claim 10, wherein the mismatch shaping block is further configured so that incrementally advancing from the lowest state is performed before incrementally advancing from the highest state.

12. A quantizer according to claim 10, wherein the mismatch shaping block is further configured so that incrementally advancing from the highest state is performed before incrementally advancing from the lowest state.

13. A quantizer according to claim 9, wherein the mismatch shaping block is further configured to normalize the sparse matrix to avoid overflow and underflow.

14. A modulator comprising a quantizer according to claim 3.

15. A cellular access terminal comprising a modulator according to claim 14.

16. A quantization method comprising:
   receiving a next weighted digital value representing a next analog voltage;
   generating a next thermometer value Dint[1] representation of the next weighted digital value;
   summing outputs of a plurality of one-bit converters to produce an analog voltage substantially equal to sum of the outputs;
   determining a number Ton of the one-bit converters that need to be switched from off to on, and a number Toff of the one-bit converters that need to be switched from on to off, wherein the next thermometer value Dint[1] is equal to (Ton−Toff) plus a current thermometer value Dint[0] representation of a current weighted digital value;
   storing state values representing history of the plurality of one-bit converters over a predetermined number of immediately preceding quantization operations, wherein the history is stored using One-Hot Encoding;
   determining a next output vector based on the history, Ton, Toff, and the current weighted digital value; and
   driving the inputs of the plurality of one-bit converters with the next output vector, one element of the next output vector per one-bit converter.

17. A quantization method according to claim 16, wherein the step of determining the next output vector comprises sorting the state values, and variance of symbols representing the state values is minimized.

18. A quantization method according to claim 17, wherein the method is performed by a quantizer, and the step of sorting is performed in a single cycle of a clock driving the quantizer.

19. A quantization method according to claim 18, wherein the method is performed by a quantizer, and the step of sorting is performed on a single edge of the clock driving the quantizer, the weighted digital values changing with the clock.

20. A quantization method according to claim 18, wherein the method is performed by a quantizer, and the step of sorting is performed on both edges of the clock driving the quantizer, the weighted digital values changing with the clock.

21. A quantization method according to claim 18, wherein the step of determining Ton and Toff is performed in accordance with a constant switching algorithm.

22. A quantization method according to claim 18, wherein the step of determining Ton and Toff is performed in accordance with an unconstrained switching algorithm.

23. A quantization method according to claim 18, further comprising updating the state values representing history with the next output vector.

24. A quantization method according to claim 18, wherein the step of storing is performed so that the state values are stored in a sparse matrix.

25. A quantization method according to claim 24, wherein the step of determining the next output vector comprises:
incrementally advancing from the lowest state in the sparse matrix to higher states until Ton is exhausted, at each state of the sparse matrix selecting one or more of the elements of the output vector that correspond to the one-bit converters that are not on and setting them to correspond to the one-bit converters being on, if possible, and decreasing Ton for each of the elements that is set to correspond to a one-bit converter that is set on;
incrementally advancing from the highest state in the sparse matrix to lower states until Toff is exhausted, at each state of the sparse matrix selecting one or more of the elements of the output vector that correspond to the one-bit converters that are not off and setting them to correspond to the one-bit converters being off, if possible, and decreasing Toff for each of the elements that is set to correspond to a one-bit converter that is set off; and
after incrementally advancing from the lowest state and incrementally advancing from the highest state, setting remaining undetermined elements of the next output vector to values of corresponding elements of a current output vector, the current output vector being based on the current thermometer value.

26. A quantization method according to claim 25, wherein incrementally advancing from the lowest state is performed before incrementally advancing from the highest state.

27. A quantization method according to claim 25, wherein incrementally advancing from the highest state is performed before incrementally advancing from the lowest state.

28. A quantization method according to claim 24, further comprising normalizing the sparse matrix to avoid overflow and underflow.

29. A method of modulating, comprising:
performing a quantization method according to claim 18 to obtain the analog voltage.

30. A method of cellular communication comprising sending a signal modulated by performing a quantization method according to claim 18.

31. A quantizer comprising:
a thermometer code converter configured to receive a next weighted digital value representing a next analog voltage and generate a next thermometer value Dint[1] representation of the next weighted digital value;
a plurality of one-bit converters, each one-bit converter comprising an input and an output;
a summer configured to receive the outputs of the plurality of one-bit converters and output an analog voltage substantially equal to sum of the outputs;
a mismatch shaping block comprising:
logic configured to determine a number Ton of the one-bit converters that need to be switched from off to on, and a number Toff of the one-bit converters that need to be switched from on to off, wherein the next thermometer value Dint[1] is equal to (Ton−Toff) plus a current thermometer value Dint[0] representation of a current weighted digital value received by the thermometer code converter,
means for storing state values representing history of the plurality of one-bit converters over a predetermined number of immediately preceding quantization operations performed by the quantizer, wherein the history is stored using One-Hot Encoding,
means for determining a next output vector based on the history, Ton, Toff, and the current weighted digital value, and
connections for driving the inputs of the plurality of one-bit converters with the next output vector, one element of the next output vector per one-bit converter.

32. A quantizer according to claim 31, wherein the means for determining the next output vector comprises means for minimizing variance of symbols representing the state values.

33. A quantizer according to claim 32, wherein the means for determining the next output vector comprises a single-cycle sorter.

34. A quantization method comprising:
receiving a next weighted digital value representing a next analog voltage;
generating a next thermometer value Dint[1] representation of the next weighted digital value;
summing outputs of a plurality of one-bit converters to produce an analog voltage substantially equal to sum of the outputs;
step for determining a number Ton of the one-bit converters that need to be switched from off to on, and a number Toff of the one-bit converters that need to be switched from on to off, wherein the next thermometer value Dint[1] is equal to (Ton−Toff) plus a current thermometer value Dint[0] representation of a current weighted digital value received by the thermometer code converter;
step for storing state values representing history of the plurality of one-bit converters over a predetermined number of immediately preceding quantization operations, wherein the history is stored using One-Hot Encoding;
step for determining a next output vector based on the history, Ton, Toff, and the current weighted digital value; and
driving the inputs of the plurality of one-bit converters with the next output vector, one element of the next output vector per one-bit converter.

35. A quantization method according to claim 34, wherein the step for determining the next output vector comprises step for sorting the state values and minimizing variance of symbols representing the state values.

36. A quantization method according to claim 35, wherein the method is performed by a quantizer, and the step for sorting and minimizing is performed in a single cycle of a clock driving the quantizer.

* * * * *